United States Patent
Ray et al.

(10) Patent No.: US 10,510,928 B2
(45) Date of Patent: Dec. 17, 2019

(54) SELF-ALIGNMENT OF OPTICAL STRUCTURES TO RANDOM ARRAY OF PRINTED MICRO-LEDS

(71) Applicant: Nthdegree Technologies Worldwide Inc., Tempe, AZ (US)

(72) Inventors: William Johnstone Ray, Phoenix, AZ (US); Richard A. Blanchard, Los Altos, CA (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

(21) Appl. No.: 16/439,141

(22) Filed: Jun. 12, 2019

(65) Prior Publication Data

US 2019/0312180 A1    Oct. 10, 2019

Related U.S. Application Data

(62) Division of application No. 16/003,432, filed on Jun. 8, 2018, now Pat. No. 10,355,172.
(Continued)

(51) Int. Cl.
*H01L 33/42* (2010.01)
*G02B 27/09* (2006.01)
(Continued)

(52) U.S. Cl.
CPC ............ *H01L 33/42* (2013.01); *G02B 5/0205* (2013.01); *G02B 27/0955* (2013.01);
(Continued)

(58) Field of Classification Search
CPC ....... H01L 33/42; H01L 33/405; H01L 33/54; H01L 33/58; H01L 33/62; H01L 33/387;
(Continued)

(56) References Cited

U.S. PATENT DOCUMENTS 7,884,543 B2 *   2/2011   Doi .................. H01L 33/62
                                                       257/98
8,415,879 B2 *   4/2013   Lowenthal ............ H01L 25/048
                                                       313/506
(Continued)

OTHER PUBLICATIONS

Wang et al., "Covalently Attached Liquids: Instant Omniphobic Surfaces with Unprecedented Repellency", Angewandte Chemie, 2016, 252-256, 5 pages.

*Primary Examiner* — Dao H Nguyen
(74) *Attorney, Agent, or Firm* — Patent Law Group LLP; Brian Ogonowsky

(57) ABSTRACT

Printed micro-LEDs have a top metal anode electrode that is relatively tall and narrow and a bottom cathode electrode. After the LED ink is cured, the bottom electrodes are in electrical contact with a conductive layer on a substrate. The locations of the LEDs are random. A thin dielectric layer is then printed between the LEDs, and a thin conductive layer, such as a nano-wire layer, is then printed over the dielectric layer to contact the anode electrodes. The top conductive layer over the tall anode electrodes has bumps corresponding with the locations of the LEDs. An omniphobic liquid is then printed which only resides in the "low" areas of the top conductive layer between the bumps. Any optical material is then uniformly printed over the resulting surface. The printed optical material accumulates only on the bump areas by adhesion and surface tension, so is self-aligned with the individual LEDs.

15 Claims, 4 Drawing Sheets

Related U.S. Application Data

(60) Provisional application No. 62/655,720, filed on Apr. 10, 2018.

(51) Int. Cl.
*G02B 5/02* (2006.01)
*H01L 33/50* (2010.01)
*H01L 23/00* (2006.01)
*H01L 33/38* (2010.01)
*H01L 25/075* (2006.01)
*H01L 33/54* (2010.01)
*H01L 33/40* (2010.01)

(52) U.S. Cl.
CPC .......... *H01L 24/26* (2013.01); *H01L 25/0753* (2013.01); *H01L 33/387* (2013.01); *H01L 33/502* (2013.01); *H01L 33/405* (2013.01); *H01L 33/54* (2013.01); *H01L 2933/0066* (2013.01)

(58) Field of Classification Search
CPC ... H01L 33/502; H01L 25/0753; H01L 24/26; H01L 24/95; G02B 5/0205; G02B 27/0955
USPC ...... 257/98, 99, 79, 88, 91, 40, 52, 53, 432, 257/E21.131, E21.159, E21.214, E31.032, 257/E31.038, E31.039, E31.047, E31.053, 257/E31.121, E31.127, E33.001, E33.056, 257/E33.067, E33.073; 438/70, 82, 99, 438/39, 27, 28, 29, 149, 166, 487, 689; 136/255, 256, 244, 252
See application file for complete search history.

(56) References Cited

U.S. PATENT DOCUMENTS 9,484,504 B2 * 11/2016 Bibl ...................... H01L 33/504
9,691,954 B2 * 6/2017 Lee ........................ H01L 33/44
9,711,759 B2 * 7/2017 Li ....................... H01L 51/5284
2009/0256169 A1 * 10/2009 Yokoyama .......... H01L 51/0096
257/98

* cited by examiner

SELF-ALIGNMENT OF OPTICAL STRUCTURES TO RANDOM ARRAY OF PRINTED MICRO-LEDS

CROSS-REFERENCE TO RELATED APPLICATIONS

This application is a divisional of U.S. application Ser. No. 16/003,432, filed Jun. 8, 2018, which is based on and claims priority from U.S. provisional application Ser. No. 62/655,720, filed Apr. 10, 2018, by William Johnstone Ray et al., assigned to the present assignee and incorporated herein by reference.

FIELD OF THE INVENTION

This invention relates to self-aligning optical structures over printed, pre-formed light emitting diodes (LEDs), where the LEDs are in a random array on a substrate as a natural result of the printing process.

BACKGROUND

It is known, by the present assignee's own work, how to form and print microscopic vertical light emitting diodes (LEDs), with the proper orientation, on a conductive substrate and connect the LEDs in parallel to form a light sheet. Details of such printing of LEDs can be found in U.S. Pat. No. 8,852,467, entitled, Method of Manufacturing a Printable Composition of Liquid or Gel Suspension of Diodes, assigned to the present assignee and incorporated herein by reference.

FIG. 1 is a cross-sectional view of a single pre-formed LED 16 that is mixed with other LEDs in a printable solution, to form an LED ink, and then printed on any surface in any pattern. Each LED 16 may have a width on the order of a human hair and may have a diameter between 10-200 microns. There are many ways to print the LEDs 16, such as screen printing, gravure printing, flexography, etc. The printing process may print the LED ink in any pattern, such as a two-dimensional shape, but the individual LEDs will be randomly located on the substrate surface as a natural result of the printing process. In the example of a blue-emitting LED 16, each LED 16 includes semiconductor GaN layers 17, including an n-layer, an active layer, and a p-layer. LEDs emitting other wavelengths may use other materials. A phosphor may be used to color-convert the light.

An LED wafer, containing many thousands of vertical LEDs, is fabricated so that the bottom metal cathode electrode 18 for each LED 16 includes a reflective layer. The top metal anode electrode 20 for each LED 16 is relatively narrow to allow almost all the LED light 21 to escape the anode side. A carrier wafer, bonded to the "top" surface of the LED wafer by an adhesive layer, may be used to gain access to both sides of the LED for metallization. The LEDs 16 are then singulated, such as by etching trenches around each LED down to the adhesive layer and dissolving the exposed adhesive layer or by thinning the carrier wafer.

The microscopic LEDs are then uniformly infused in a solvent, including a viscosity-modifying polymer resin, to form an LED ink for printing.

If it is desired for the anode electrodes 20 to be oriented in a direction opposite to the substrate after printing, the electrodes 20 are made tall so that the LEDs 16 are rotated in the solvent, by fluid pressure, as they settle on the substrate surface. The LEDs 16 rotate to an orientation of least resistance. Over 90% like orientation has been achieved.

Once the LEDs 16 are printed as a monolayer on the substrate, they are in a non-deterministic random array as a natural result of the LEDs being randomly located within the solvent when printed.

In some applications, it may be desirable to precisely position an individual lens, a phosphor, quantum dots, or other optical structure directly over each printed LED 16 without covering areas between the LEDs 16. However, this is impractical using prior art techniques since the LEDs 16 are very small and randomly located.

What is needed is a technique for precisely positioning optical structures directly over printed LEDs, where the technique is suitable for a high speed manufacturing process, such as a roll-to-roll manufacturing process.

SUMMARY

A technique for self-aligning individual optical structures directly over associated LEDs in a random array of printed LEDs is disclosed.

The LEDs have a top metal anode electrode that is relatively tall and narrow and a large and wide bottom cathode electrode so that fluid dynamics cause the LEDs to settle on the substrate with the cathodes facing downward (in contact with a conductive layer) and the anodes facing upward. In one example, the LEDs are 10-200 microns wide, and the anode electrode extends 10-200 microns above the LED semiconductor layers. The polarity of the LEDs may be reversed, where the tall and narrow "top" electrode may be the cathode electrode.

The shape of the LEDs may be customized for use with the inventive method and are not necessary the prior art LEDs described above.

After the LED ink is cured, the bottom cathodes are in electrical contact with a conductive layer on the substrate. A thin dielectric layer is then printed over the LEDs and conductive layer to insulate the conductive layer. The tall anode electrodes protrude through the dielectric layer. A thin conductive layer, such as a nano-wire layer, is then printed over the dielectric layer and anode electrodes and then cured so that the anode electrodes are in electrical contact with the top conductive layer. The printed LEDs are now all connected in parallel by the two conductive layers.

The top conductive layer over the tall anode electrode has bumps corresponding with the locations of the anode electrodes.

A commercially available omniphobic liquid is then printed as a very thin layer over the top conductive layer. The omniphobic liquid is designed to repel most other materials, such as the top conductor material. The omniphobic liquid has a viscosity and surface tension such that it wicks off the bumps and only resides in the "low" areas of the top conductive layer between the bumps. The omniphobic layer is then cured so that the conductive layer bumps are exposed through the omniphobic layer above each of the printed LEDs. The exposed portion is about the same size as the underlying LED.

Any optical material is then uniformly printed over the resulting surface. The optical material may be a clear acrylic, phosphor particles in a liquid binder, quantum dots in a liquid binder, or any other optical material. The acrylic or liquid binder is repelled by the cured omniphobic layer between the bumps but adheres to the bump areas (i.e., the exposed top conductive layer) directly over the LEDs. The printed optical material accumulates on the bump areas by surface tension. The optical material is then cured, such as by heat or UV. Curing may simply harden the material or dissolve any solvent, depending on the material.

The acrylic or liquid binder may naturally form a generally hemispherical optical structure over each LED, and the amount of the optical material printed determines the height and shape of the generally hemispherical optical structure.

In this way, lenses may be formed over each LED. The lenses may diffuse the light or refract the light in any desired way. If the optical material is a wavelength conversion material, the primary LED light may be converted into a longer wavelength light. The primary LED light, such as blue, may be combined with the secondary light to create a wide gamut of colors.

In one embodiment, areas of the substrate surface containing a subset of all the printed LEDs may be masked during printing of the optical material so that the optical material is only over the subset of the LED to achieve one type of optical effect, such as a particular color. Then, other portions of the substrate are masked and a different optical material is printed to achieve another type of optical effect for a different subset of the LEDs. In this manner, red, green, and blue pixels, or other color patterns, may be formed in selected areas, or any other optical pattern may be created.

The invention of using exposed bumps to self-align structures is not limited to only printed LEDs but is applicable to any other technology where structures are to be self-aligned with a random array of devices. The aligned structures are not limited to optical structures.

BRIEF DESCRIPTION OF THE DRAWINGS

FIG. 2 is a horizontal bisected cross-section of FIG. 3.

DETAILED DESCRIPTION

An example of the invention is described with reference to printing LEDs and self-aligning optical structures over each LED. However, the invention may be used to self-align any structures over any printed devices where the printed devices are randomly located on a substrate. The invention may be used in any situation where a bump is created over a device, since an omniphobic layer forms an opening self-aligned with each bump, and any subsequently deposited liquid adheres only to the bump area self-aligned with the device.

Figure 1:
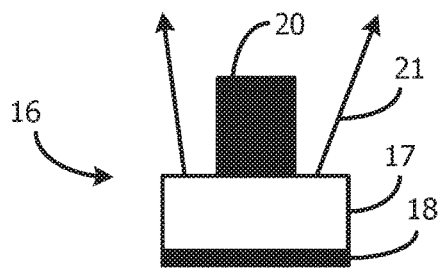
FIG. 1 is a cross-sectional view of a printable micro-LED designed by the present assignee.
Figure 2:
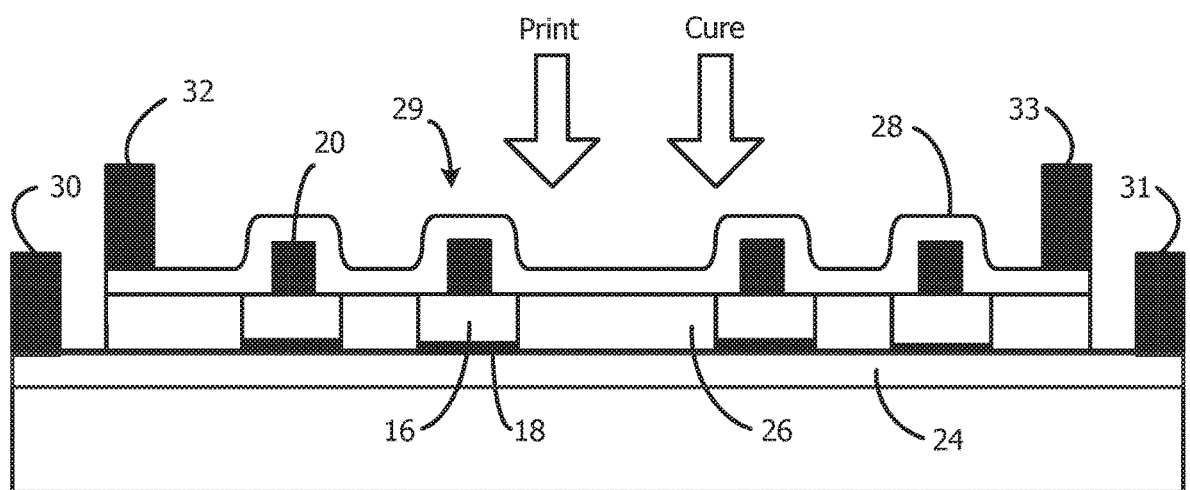
FIG. 2 is a cross-sectional view of a random array of printed micro-LEDs connected in parallel by sandwiching the LEDs between a bottom conductive layer and a thin top conductive layer. Bumps in the top conductive layer are over each LED due to the tall anode electrodes of each LED.

FIG. 2 illustrates a random array of printed LEDs 16 connected in parallel on a substrate 22. The LEDs 16 may be the same as the prior art LED 16 in FIG. 1 or may be modified versions in order to provide the desired shape bump used to self-align the optical structures.

In FIG. 2, a starting substrate 22 is provided. If the substrate 22 itself is not conductive, a reflective conductor layer 24 (e.g., aluminum) is deposited on the substrate 22 such as by printing. The substrate 50 is preferably thin and flexible for light weight, low cost, good heat conduction to air or a heat sink, and ease of processing. The substrate 22 may be a suitable polymer, such as polycarbonate, PMMA, or PET, and may be flexible so as to be dispensed from a roll. The substrate 22 can be any size suitable for the ultimate product. The starting substrate 22 may even be a conventional flex-circuit substrate, where metal (e.g., copper) traces have been already formed on the substrate 22 for electrically accessing the various conductor layers.

The LEDs 16 are then printed on the conductor layer 24 such as by flexography, where a pattern on a rolling plate determines the deposition for a roll-to-roll process, or by screen printing with a suitable mesh to allow the LEDs to pass through and control the thickness of the LED layer. The LEDs 16 may be printed in any pattern, such as a two-dimensional shape, but the precise locations of the LEDs within the pattern are unpredictable due to the LEDs 16 being printed as an LED ink. Because of the comparatively low concentration, the LEDs 16 will be printed as a monolayer and be fairly uniformly distributed, yet randomly arranged, over the conductor layer 24.

The LED ink solvent is then evaporated by heat using, for example, an infrared oven. After such curing, the LEDs 16 remain attached to the underlying conductor layer 24 with a small amount of residual resin that was dissolved in the LED ink as a viscosity modifier. The adhesive properties of the resin and the decrease in volume of resin underneath the LEDs 16 during curing press the bottom LED electrode 18 against the underlying conductor 24, making ohmic contact with it.

A dielectric layer 26 is then printed over the surface and cured to encapsulate the LEDs 16 and further secure them in position. The tall anode electrode 20 protrudes through the dielectric layer 26. The dielectric layer 26 is designed to self-planarize during curing, by surface tension, so as to pull off of or de-wet the electrode 20. Therefore, etching the dielectric layer 26 is not required. If the dielectric layer 26 still adheres to the electrode 20, then a brief blanket etch may be used to expose the electrode 20.

A top transparent conductor layer 28 is then printed over the dielectric layer 26 to electrically contact the electrodes 20 and is cured in an oven appropriate for the type of transparent conductor being used. The conductor layer 28 ink wets the dielectric layer 26 and the electrode 20 fairly uniformly so forms a substantially uniformly thick layer over all surfaces. The printing process ensures that the conductor layer ink is deposited uniformly. In one embodiment, the conductor layer 28 comprises silver alloy nano-wires in a solution. The nano-wires overlap at random angles after printing. When the printed layer is cured (heated), the overlapping wires are sintered together to create a highly conductive but fairly transparent mesh. Such transparent conductor printable solutions are well-known and commercially available.

By making the transparent conductor layer 28 much thinner than the electrodes 20, bumps 29 in the conductor layer 28 are formed. The height of the bump 29 depends on the heights of the top electrodes 20 and the thickness of the conductor layer 28. A bump 29 having a height of only a few microns is needed for the present invention and, in one embodiment, the height of the bump 29 is at least 10 microns above the trough of the conductor layer 28. A larger bump 29 will result in a wider area for adherence by the optical structure, as described later. So the dimensions of the optical structure can be customized by controlling the bump 29 size. In the example, the width of each bump 29 is sufficient to completely cover the associated LED 16 with an optical structure, described later.

The LEDs 16 are now all electrically connected in parallel. At a suitable point in the fabrication process, if needed to spread current, metal bus bars 30-33 are then printed along opposite edges of the conductor layers 24 and 28 and electrically terminate at anode and cathode leads (not shown), respectively, for energizing the LEDs 16. The bus bars 30-33 will ultimately be connected to a positive or negative driving voltage.

Figure 3:
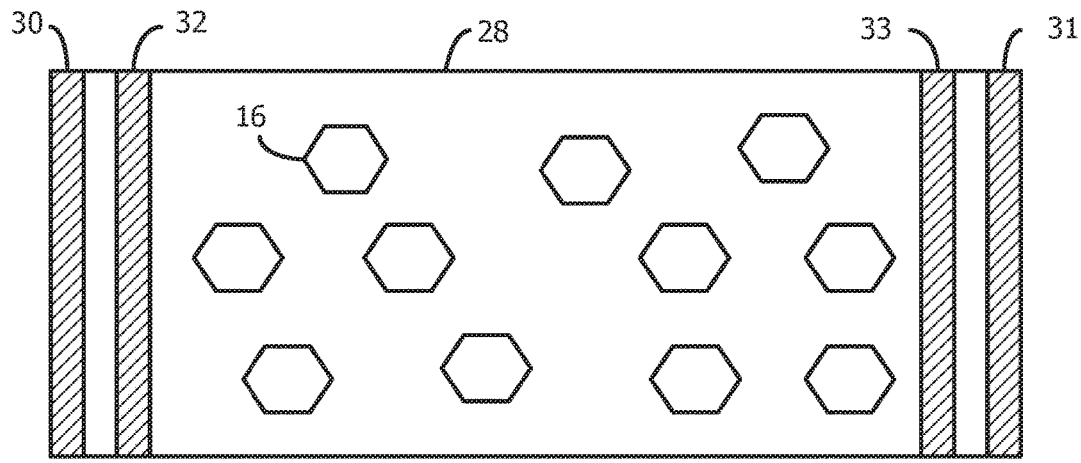
FIG. 3 is a top down view of a substrate showing the random locations of the printed LEDs, where each LED has a hexagonal footprint.

FIG. 3 is a top down view of the structure of FIG. 2. The cross-section of FIG. 2 is a horizontal bisection of FIG. 3. The locations of the LEDs 16 in the printed layer are random. In the example, the LED footprints are hexagons.

If a suitable voltage differential is applied to the anode and cathode leads, all the LEDs 16 with the proper orientation will be illuminated.

Figure 4:
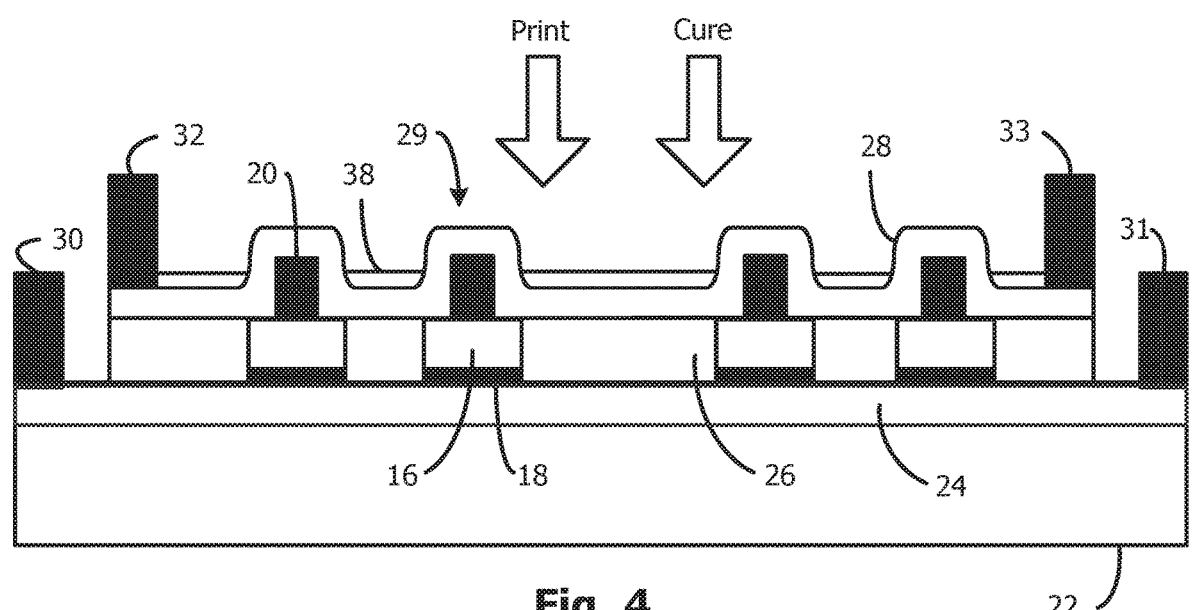
FIG. 4 illustrates the structure of FIG. 2 with a liquid omniphobic layer printed over it, then cured, where the omniphobic layer wicks off the bumps by surface tension.

Next, as shown in FIG. 4, an omniphobic liquid is uniformly deposited as an ink over the top conductor layer 28, including over the bumps 29, and cured to form an omniphobic layer 38. The omniphobic liquid, by definition, does not adhere to a wide variety of materials, including the top conductor layer 28. The omniphobic liquid is designed to have a low viscosity and adequate surface tension so it wicks off (de-wets) the bumps 29 by surface tension and pools in the troughs between the bumps 29. The de-wetting only takes a few seconds. The amount of omniphobic liquid deposited should be such that the bumps 29 of the conductor layer 28 that protrude through the omniphobic layer 38 do not cover any portion of the light emitting area of the LEDs 16. Suitable omniphobic liquids with a selected viscosity and surface tension are commercially available. One suitable omniphobic liquid is described in the paper, Covalently Attached Liquids: Instant Omniphobic Surfaces with Unprecedented Repellency, by Wang et al., Agnew. Chem. 2016, 128, 252-256, incorporated herein by reference. The omniphobic liquid only needs to be phobic to the materials used in the present process.

Figure 5:
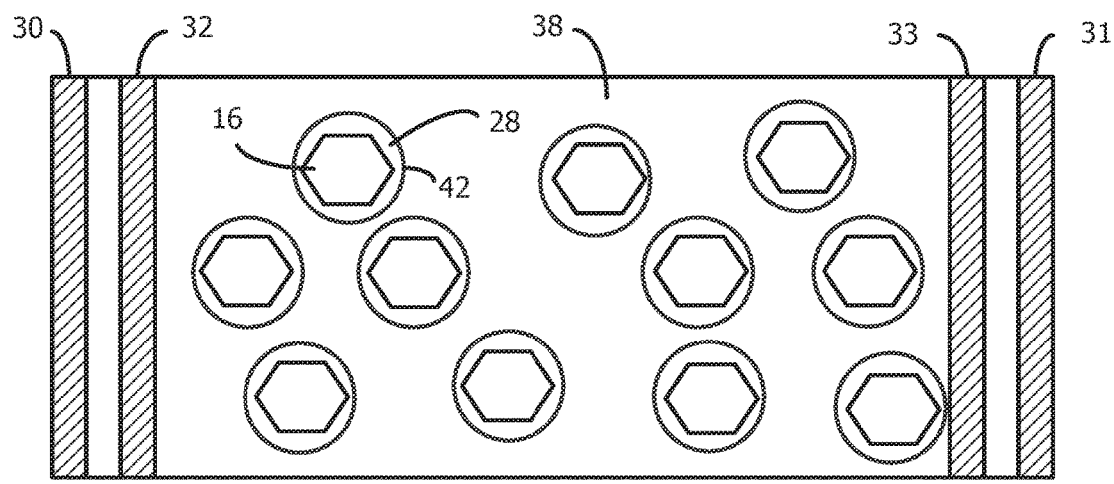
FIG. 5 is a top down view of the structure of FIG. 4, showing the area above each LED not covered by the omniphobic layer.

FIG. 5 is a top down view of the structure of FIG. 4 showing how the cured omniphobic layer 38 has openings 42 surrounding each LED 16 through which the top conductor layer 28 bumps protrude a selected amount. The omniphobic layer 38 should be as thin as possible, such as on the order of a micron, so as to maximize the size of the self-aligned openings 42.

If appropriate, a thin layer of a material may be coated over the transparent conductor layer 28 prior to depositing the omniphobic liquid if needed to promote the de-wetting off the bumps 29. Therefore, the omniphobic layer 38 is not required to be in direct contact with the conductor layer 28.

Figure 6:
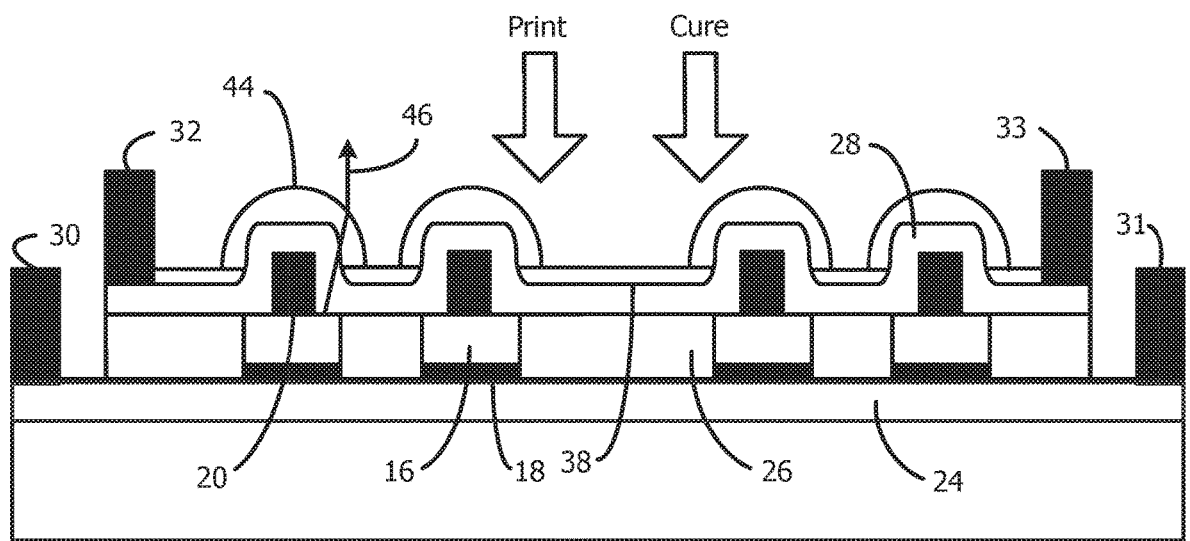
FIG. 6 illustrates the structure of FIG. 4 after a liquid optical material is printed, sprayed, or otherwise deposited over the structure and adheres to only the top conductive layer bump that protrudes through the omniphobic layer. Assuming the optical material is a clear lens material, a light ray is shown being refracted by the lens.

As shown in FIG. 6, an optical structure ink 44 is then uniformly printed over the structure of FIGS. 4 and 5. In one example, the optical structure ink 44 is a transparent polymer, such as an acrylic, that will form hemispherical lenses over each LED 16. In another embodiment, the optical structure ink 44 may be a diffusive material to diffuse the light from the LEDs 16. In another embodiment, the optical structure ink 44 may be phosphor particles or quantum dots infused in a liquid binder.

The liquid polymer or binder is repelled by the omniphobic layer 38 and only wets the exposed conductor layer 28 at the bumps. Surface tension pulls all the surrounding liquid polymer or binder off the omniphobic layer 38 and forms a generally hemispherical optical structure on the bumps covering each LED 16. Therefore, the optical structures are self-aligned with the LEDs 16.

In the example of FIG. 6, the optical structure ink 44 is a transparent acrylic that, after curing, forms a lens. A light ray 46 from an energized LED 16 is shown being refracted by the lens. The ink 44, after curing, may even be just for providing a desired index of refraction to improve light extraction.

The amount (volume) of the optical structure ink 44 deposited determines the thickness and shape of the optical structure over the LEDs 16.

Figure 7:
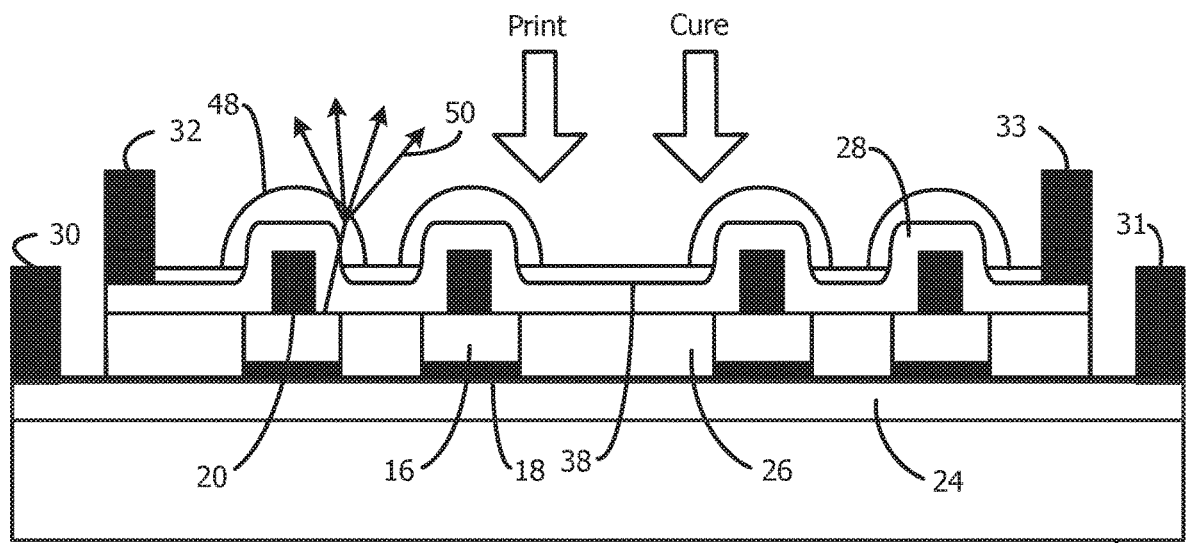
FIG. 7 illustrates an example where the optical material is a diffusing material or a wavelength conversion material where the material scatters light.

FIG. 7 is identical to FIG. 6 except the optical material 48 is diffusing, such as an acrylic with light scattering particles, or phosphor particles in a transparent binder, or quantum dots in a transparent binder. Light rays 50 are shown being scattered by the optical material 48.

If appropriate, a thin layer of a material may be coated over the bumps 29 prior to depositing the optical material 48 if needed to promote adhering the optical material 48 to the bumps 29. Therefore, the optical material 48 is not required to be in direct contact with the conductor layer 28.

Different areas of the LED sheet may receive different optical structures, such as different phosphor layers, by masking the areas prior to depositing the optical structure ink. For example, a large sheet may contain random arrangements of LEDs within dots that may be selectively energized as individual pixels. A mask for the red pixels may have openings just for the red pixels, and a red phosphor ink is deposited so that the red phosphor ink is only self-aligned to the LEDs in the red pixel dots. A green mask may be used to expose dots of LEDs associated with green pixels, and a green phosphor ink is then only deposited in the mask openings to self-align with the LEDs in the green pixels. Blue pixels may not need any phosphor if the LEDs emit blue light.

In another embodiment, multiple layers of optical structures may be self-aligned with the LEDs 16 since the optical structure inks will only adhere to the top electrode 20 or to the other optical structure inks. For example, multiple phosphor layers may be self-aligned over each LED 16, followed by a self-aligned lens layer.

Many other variations are envisioned.

Figure 8:
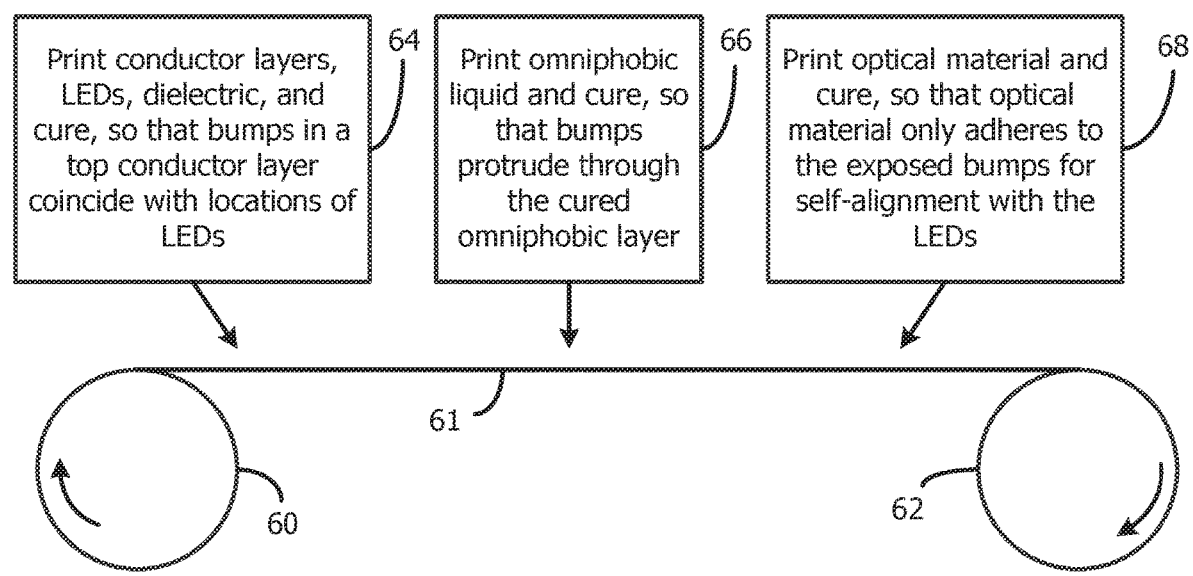
FIG. 8 illustrates how the printing of all devices and layers, and the self-alignment of the optical structures, may be perfomed in a high speed roll-to-roll process for very low cost.

FIG. 8 schematically illustrates one possible assembly line for manufacturing the sheets of LEDs, having the optical structures, by printing in a roll-to-roll process. The roll 60 contains the substrate material 61, and the roll 62 is a take-up roll. The various stations are labeled. The process sequentially prints the various layers and cures the layers. Flexography is preferred for printing using a roll-to-roll process. In the example, the functional block 64 prints the conductor inks, LED inks, dielectric inks, and cures the inks, resulting in bumps in the top conductor layer coinciding with the locations of the LEDs (FIG. 2). The functional block 66 prints and cures the omniphobic liquid and cures it, resulting in the bumps protruding through the cured omniphobic layer (FIG. 4). The functional block 68 prints the optical material self-aligned to the bumps in the top conductor layer (FIGS. 6 and 7).

Although an omniphobic material has been used as an example, the repulsion need only be of the materials used in the process for forming the LED sheets, such as the top conductor layer 28 and the optical structure ink.

The various directional attributes used herein, such as bottom, top, and vertical, are not to be construed to convey absolute directions relative to the Earth's surface but are used to convey orientations relative to the enclosed figures when the drawing sheets are held upright.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method comprising:
    printing devices on a substrate such that the devices are randomly arranged on the substrate;
    covering the devices and areas between the devices with a first layer such that bumps are in the first layer coinciding with the locations of the devices;
    depositing a liquid second layer overlying the first layer that does not adhere to the bumps so that the liquid second layer only resides in areas between the bumps, due to surface tension, resulting in at least portions of the bumps protruding through the liquid second layer;
    curing the liquid second layer to form a cured second layer; and
    depositing a first material over the bumps and the cured second layer, wherein the first material only adheres to the bumps that protrude through the cured second layer, such that the first material is self-aligned with the devices.

2. The method of claim 1 wherein the devices are light emitting diodes (LEDs) printed on the substrate, and the first material that adheres to the bumps comprise optical structures self-aligned with the LEDs.

3. The method of claim 2 wherein the first layer comprises an electrically conductive layer that electrically contacts an electrode of the LEDs.

4. The method of claim 3 wherein the cured second layer is an omniphobic layer.

5. The method of claim 2 wherein the first material comprises a transparent lens material.

6. The method of claim 2 wherein the first material comprises a diffusing lens material.

7. The method of claim 2 wherein the first material comprises a wavelength conversion material in a binder.

8. The method of claim 2 wherein the LEDs have a top electrode that causes the bumps in the first layer.

9. The method of claim 8 wherein the first layer comprises a metal nano-wire layer forming a transparent conductor layer.

10. The method of claim 1 wherein the second layer directly contacts the first layer.

11. The method of claim 1 wherein the first material directly contacts the first layer.

12. The method of claim 1 wherein the devices are light emitting diodes (LEDs) printed on the substrate, and the first material that adheres to the bumps comprise optical structures self-aligned with the LEDs, the method further comprising:
    forming a first conductor layer electrically contacting a bottom electrode of the LEDs; and
    forming a dielectric layer overlying the first conductor layer and in-between the LEDs,
    wherein the first layer is a second conductor layer electrically contacting a top electrode of the LEDs.

13. The method of claim 1 wherein the liquid second layer wicks off the bumps by surface tension to reside in the areas between the bumps.

14. The method of claim 1 wherein the method forms a light emitting diode (LED) light sheet.

15. The method of claim 1 wherein the first material directly contacts the first layer.

* * * * *